(12) United States Patent
Cheng et al.

(10) Patent No.: US 11,791,396 B2
(45) Date of Patent: Oct. 17, 2023

(54) FIELD EFFECT TRANSISTOR WITH MULTIPLE GATE DIELECTRICS AND DUAL WORK-FUNCTIONS WITH PRECISELY CONTROLLED GATE LENGTHS

(71) Applicant: International Business Machines Corporation, Armonk, NY (US)

(72) Inventors: Kangguo Cheng, Schenectady, NY (US); Ruilong Xie, Niskayuna, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 17/371,714

(22) Filed: Jul. 9, 2021

(65) Prior Publication Data
US 2023/0008763 A1 Jan. 12, 2023

(51) Int. Cl.
*H01L 29/66* (2006.01)
*H01L 29/423* (2006.01)

(52) U.S. Cl.
CPC .. *H01L 29/66484* (2013.01); *H01L 29/42368* (2013.01); *H01L 29/66545* (2013.01); *H01L 29/66553* (2013.01)

(58) Field of Classification Search
CPC ......... H01L 29/66484; H01L 29/66545; H01L 29/66553; H01L 29/7831; H01L 29/42368; H01L 29/4966; H01L 29/4983; H01L 29/512; H01L 29/517; H01L 29/66575; H01L 29/78
See application file for complete search history.

(56) References Cited

U.S. PATENT DOCUMENTS

| | | |
|---|---|---|
| 5,956,588 A | 9/1999 | Choi et al. |
| 6,087,225 A | 7/2000 | Bronner et al. |
| 7,256,141 B1 * | 8/2007 | Ramsbey .......... H01L 27/11568 438/653 |
| 9,171,951 B2 | 10/2015 | Miyata |
| 9,564,505 B2 | 2/2017 | Chudzik et al. |
| 10,374,048 B2 | 8/2019 | Chou et al. |
| 2009/0273013 A1 * | 11/2009 | Winstead ............... H10B 43/40 438/257 |

(Continued)

FOREIGN PATENT DOCUMENTS

CN 111477679 A 7/2020

*Primary Examiner* — Nicholas J Tobergte
*Assistant Examiner* — Kevin Quinto
(74) *Attorney, Agent, or Firm* — Scully, Scott, Murphy & Presser, P.C.; Samuel Waldbaum

(57) ABSTRACT

A multiple gate dielectrics and dual work-functions field effect transistor (MGO-DWF-FET) is provided on an active region of a semiconductor substrate. The MGO-DWF-FET includes a first functional gate structure including a U-shaped first high-k gate dielectric material layer and a first work-function metal-containing structure, and a laterally adjacent, and contacting, second functional gate structure that includes a U-shaped second high-k gate dielectric material layer and a second work-function metal-containing structure. The first functional gate structure has a gate length that differs from a gate length of the second functional gate structure.

17 Claims, 12 Drawing Sheets

(56) References Cited

U.S. PATENT DOCUMENTS

| | | | | |
|---|---|---|---|---|
| 2010/0029052 A1* | 2/2010 | Kang | ................ | H10B 41/30 |
| | | | | 438/257 |
| 2010/0099246 A1* | 4/2010 | Herrick | ............ | H01L 29/42344 |
| | | | | 257/E21.679 |
| 2015/0249140 A1* | 9/2015 | Shroff | ............... | H01L 29/66545 |
| | | | | 438/592 |
| 2020/0259018 A1 | 8/2020 | Rami et al. | | |

* cited by examiner

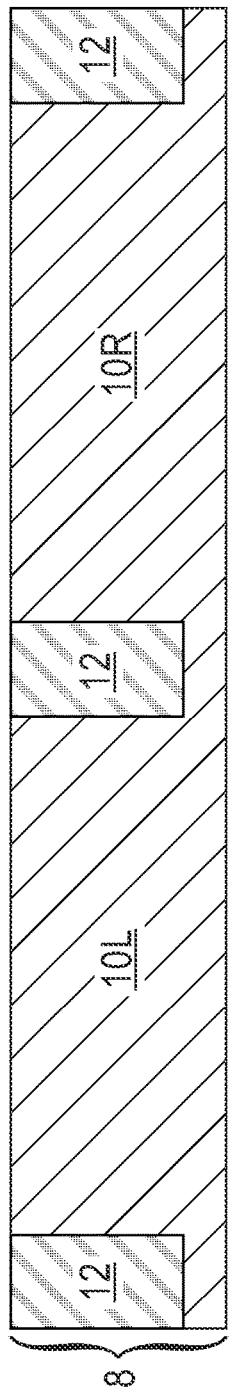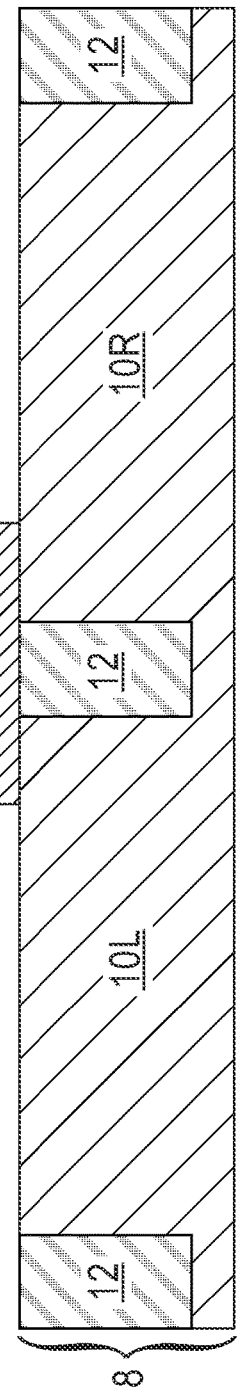

US 11,791,396 B2

FIELD EFFECT TRANSISTOR WITH MULTIPLE GATE DIELECTRICS AND DUAL WORK-FUNCTIONS WITH PRECISELY CONTROLLED GATE LENGTHS

BACKGROUND

The present application relates to semiconductor technology, and more particularly to a semiconductor structure with a replacement gate structure that includes dual high-k gate dielectrics and dual work-function metals, and a method of forming the same.

A field effect transistor (FET) with multiple gate oxides (or gate dielectrics) and dual work-functions (MGO-DWF) has been pursued as a viable approach to scale FETs for a radio frequency (RF) power amplifier. MGO-DWF FETs have two gates, one of the gates is located on the source side and the other gate is located on the drain side. Each gate of an MGO-DWF FET has a different gate dielectric and a different gate work-function metal.

Gate lengths of each side (source or drain) is critical and has a strong effect on the characteristic and thus the performance of the MGO-DWF FET. Given the asymmetric nature of the MGO-DWF FET, it has been found that it is challenging to control each portion of the gate length by conventional approaches. Prior approaches rely on lithography which is susceptible to overlay and critical dimension variations. There is thus a need for improving MGO-DWF FETs.

SUMMARY

An MGO-DWF FET with precisely controlled gate length on the source side and the drain side, respectively, is provided as well as a method of forming the same. Specifically, each portion of the gate length is precisely controlled by double spacer thicknesses without the need of any additional mask. The gate dielectric material thickness as well as work-function metal for each portion of the gate can be independently tuned.

In one aspect of the present application, a semiconductor structure is provided. In one embodiment of the present application, the semiconductor structure includes a multiple gate dielectrics and dual work-functions field effect transistor (MGO-DWF-FET) located on an active region of a semiconductor substrate. The MGO-DWF-FET of the present application includes a first functional gate structure comprising a U-shaped first high-k gate dielectric material layer and a first work-function metal-containing structure, and a laterally adjacent, and contacting, second functional gate structure comprising a U-shaped second high-k gate dielectric material layer and a second work-function metal-containing structure.

In another aspect of the present application, a method of forming a semiconductor structure is provided. In one embodiment of the present application, the method includes forming a sacrificial gate dielectric material layer on the active region and exposed sidewalls and a topmost surface of a mandrel structure that is located on an active region of a semiconductor substrate. Next, a first sacrificial gate is formed laterally adjacent to a vertical portion of the sacrificial gate dielectric material layer that is present along sidewalls of the mandrel structure, and thereafter a second sacrificial gate is formed laterally adjacent to the first sacrificial gate, wherein the first sacrificial gate has a lateral thickness that differs from a lateral thickness of the second sacrificial gate. Next, the sacrificial gate dielectric material layer that is present on the topmost surface of the mandrel structure is removed and thereafter the mandrel structure and the sacrificial gate dielectric material layer that is not protected by the first and second sacrificial gates are removed. The second sacrificial gate and the sacrificial gate dielectric material layer that is located beneath the second sacrificial gate are then replaced with a first functional gate structure comprising a U-shaped first high-k gate dielectric material layer and a first work-function metal-containing structure. Next, the first sacrificial gate and the sacrificial gate dielectric material layer that is located beneath the first sacrificial gate are replaced with a second functional gate structure comprising a U-shaped second high-k gate dielectric material layer and a second work-function metal-containing structure.

BRIEF DESCRIPTION OF THE DRAWINGS

FIG. 1 is a cross sectional view of an exemplary semiconductor structure that can be employed in accordance with an embodiment of the present application, the exemplary semiconductor structure includes a semiconductor substrate having at least one active region that is laterally surrounded by an isolation structure.

FIG. 2 is a cross sectional view of the exemplary semiconductor structure of FIG. 1 after forming a mandrel structure on a portion of the at least one active region.

DETAILED DESCRIPTION

Figure 3:
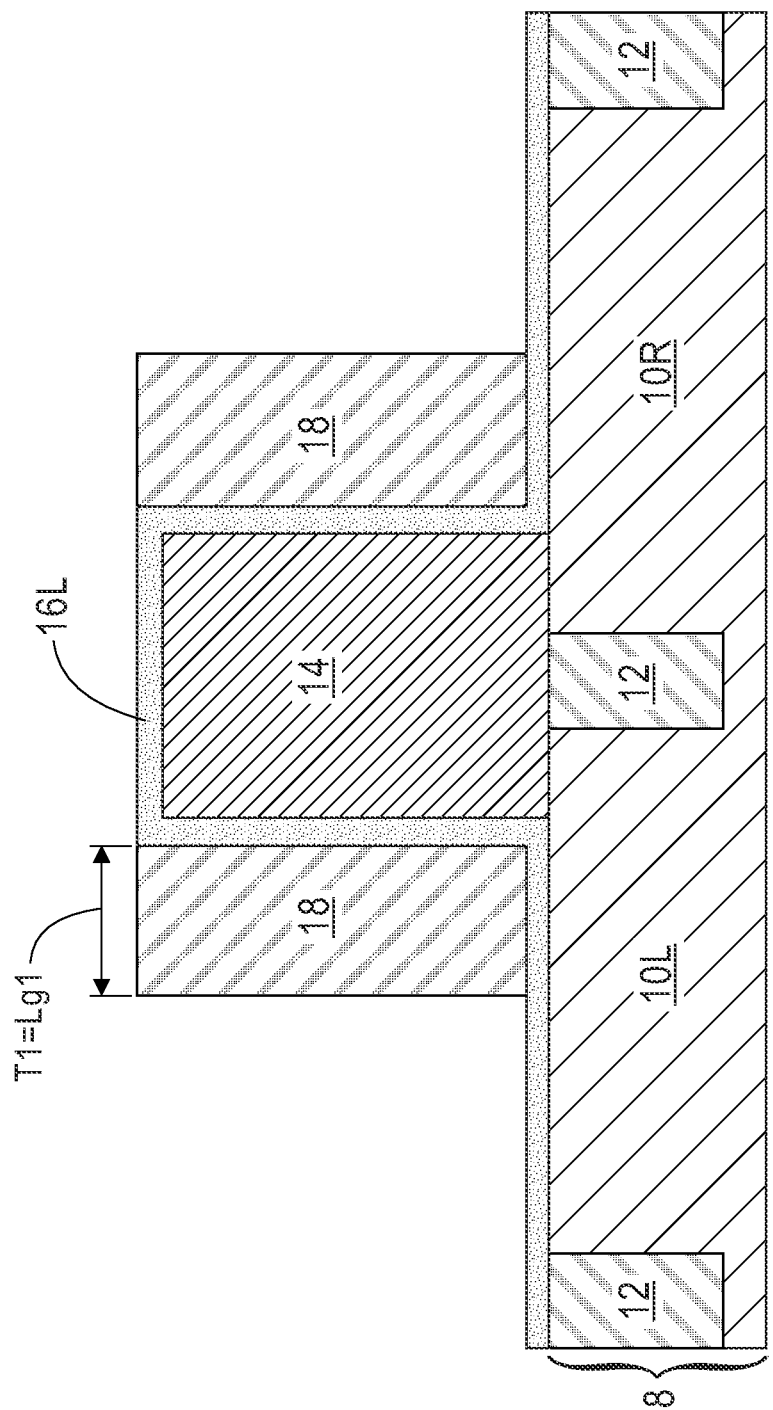
FIG. 3 is a cross sectional view of the exemplary semiconductor structure of FIG. 2 after forming a sacrificial gate dielectric material layer on the at least one active region and exposed sidewalls and a topmost surface of the mandrel structure, and forming a first sacrificial gate laterally adjacent to a vertical portion of the sacrificial gate dielectric material layer that is present along the sidewalls of the mandrel structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure includes a semiconductor substrate 8 having at least one active region 10L, 10R that is laterally surrounded by an isolation structure 12. In FIG. 1 and by way of one example, the exemplary semiconductor structure includes a first active region 10L and a second active region 10R; each of these active regions 10L, 10R is laterally surrounded by an isolation region 12. In the present application, the at least one active region 10L, 10R is a semiconductor material portion of the semiconductor substrate 8 in which an MGO-DWF FET in accordance with the present application will be subsequently formed thereon.

The semiconductor substrate 8 that can be employed in the present application includes at least one semiconductor material that has semiconducting properties. Examples of semiconductor materials that can be used as the semiconductor substrate 8 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 8 is a bulk semiconductor substrate. The term "bulk semiconductor substrate" denotes a substrate that is composed entirely of one or more semiconductor materials. In one example, the bulk semiconductor substrate is composed entirely of Si. When a bulk semiconductor substrate is employed as the semiconductor substrate 8, the at least one active region 10L, 10R is located in an upper semiconductor material portion of the bulk semiconductor substrate.

In some embodiments, the semiconductor substrate 8 is composed of a semiconductor-on-insulator substrate (SOI). A SOI substrate typically includes a handle substrate, an insulator layer, and a topmost semiconductor material layer. In some embodiments, the handle substrate of the SOI may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above. When a SOI substrate is employed as the semiconductor substrate 8, the at least one active region 10L, 10R is located in the topmost semiconductor material layer of the SOI semiconductor substrate.

The isolation structure 12 can be composed of a dielectric material such as, for example, silicon dioxide, silicon nitride, silicon oxynitride, or any suitable combination of those dielectric materials. In some embodiments of the present application, the isolation structure 12 can be formed by first forming a trench within the semiconductor substrate 8, and then filling the trench with at least one of the dielectric materials mentioned above. A material removal process such as, for example, planarization and/or etching, can follow the trench fill. In some embodiments, and as shown in the FIG. 1, the isolation structure 12 has a topmost surface that is coplanar with a topmost surface of the semiconductor substrate 8.

In other embodiments of the present application (not shown), the semiconductor substrate 8 is first processed to include at least one semiconductor material portion (i.e., semiconductor fin) containing the at least one active region 10L, 10R, and thereafter the isolation structure 12 can be formed utilizing a conventional deposition process such as, for example, chemical vapor deposition (CVD) or plasma enhanced chemical vapor deposition (PECVD). In some embodiments, an etch back process can follow the deposition of the dielectric material that provides the isolation structure 12. In such an embodiment (not shown), the isolation structure 12 can have a topmost surface that is located beneath the topmost surface of the substrate material portion (i.e., semiconductor fin) containing the at least one active region 10L, 10R.

Referring now to FIG. 2, there is illustrated the exemplary semiconductor structure of FIG. 1 after forming a mandrel structure 14 on a portion of the at least one active region 10L, 10R. In the embodiment illustrated in FIG. 1, the mandrel structure 14 is formed on a first portion of the first active region 10L, a first portion of the second active region 10R and the isolation structure 12 that is located between the first and second active regions 10L, 10R. It is noted that the mandrel structure 14 does not cover an entirety of the at least one active region 10L, 10R.

The mandrel structure 14 is composed of a mandrel dielectric material which can be compositionally the same as, or compositionally different from, the dielectric material that provides the sacrificial gate dielectric material layer 16L (to be subsequently formed). In one example, the mandrel structure 14 is composed of silicon nitride, and the sacrificial gate dielectric material layer 16L is composed of silicon dioxide. Other dielectric materials besides silicon nitride can be used as the mandrel dielectric material.

The mandrel structure 14 can be formed by first depositing a blanket layer of the mandrel dielectric material, and thereafter patterning the blanket layer of the mandrel dielectric material. The depositing of the blanket layer of the mandrel dielectric material can include CVD, PECVD, physical vapor deposition (PVD) or any other like deposition process. The patterning of the blanket layer of mandrel dielectric material can include lithography and etching.

In the present application, the height of the mandrel structure 14 determines the height of the MGO-DWF FET to be subsequently formed. In one example, the mandrel structure 14 has a height from about 50 nm to 200 nm; although other heights besides this one example can be used in the present application. The mandrel structure 14 typically has a width from 100 nm to 500 nm.

Referring now to FIG. 3, there is illustrated the exemplary semiconductor structure of FIG. 2 after forming a sacrificial gate dielectric material layer 16L on the at least one active region 10L, 10R and exposed sidewalls and a topmost surface of the mandrel structure 14, and forming a first sacrificial gate 18 laterally adjacent to a vertical portion of the sacrificial gate dielectric material layer 16L that is present along the sidewalls of the mandrel structure 14.

The sacrificial gate dielectric material layer 16L is composed of a dielectric material such as, for example, an oxide or a nitride, which is typically, but not necessarily always, compositionally different from the mandrel dielectric material that provides mandrel structure 14. In one embodiment, the sacrificial gate dielectric material layer 16L can be composed of silicon dioxide, silicon nitride, or silicon oxynitride. The sacrificial gate dielectric material layer 16L can be formed by a conformal deposition process, including but not limited to, CVD, PECVD or PVD. The sacrificial gate dielectric material layer 16L is a conformal layer which can have a thickness from 1 nm to 10 nm, although lesser and greater thicknesses can also be employed. As used herein, the term "conformal layer" denotes that a material layer has a vertical thickness along horizontal surfaces that is substantially the same (i.e., within ±5%) as the lateral thickness along vertical surfaces.

In some embodiments, the first sacrificial gate 18 can be composed of a first semiconductor material including, but not limited to, polysilicon, amorphous silicon, or amorphous silicon germanium. In other embodiments, the first sacrificial gate 18 can be composed of a first metal-containing material such as, for example, tungsten, titanium, tantalum, aluminum, nickel, ruthenium, palladium, platinum, or alloys thereof. The first semiconductor material and the first metal-containing material collectively can be referred to a "first sacrificial gate material".

The first sacrificial gate 18 can be formed by conformal deposition of the first sacrificial gate material, followed by a directional etch such as reactive ion etch (RIE). The conformal deposition of the first sacrificial gate material can include, CVDS, PECVD, PVD or atomic layer deposition (ALD). The directional etching can include a reactive ion etching that is selective in removing the first sacrificial gate material relative to the sacrificial gate dielectric material layer 16L. The directional etch provides a first sacrificial gate 18 having a vertical pillar shape and a first lateral thickness T1 as measured from an innermost sidewall to an outermost sidewall of the vertical pillar. It is noted that the first lateral thickness T1 determines the first gate length Lg1 of the MGO-DWF FET of the present application.

Figure 4:
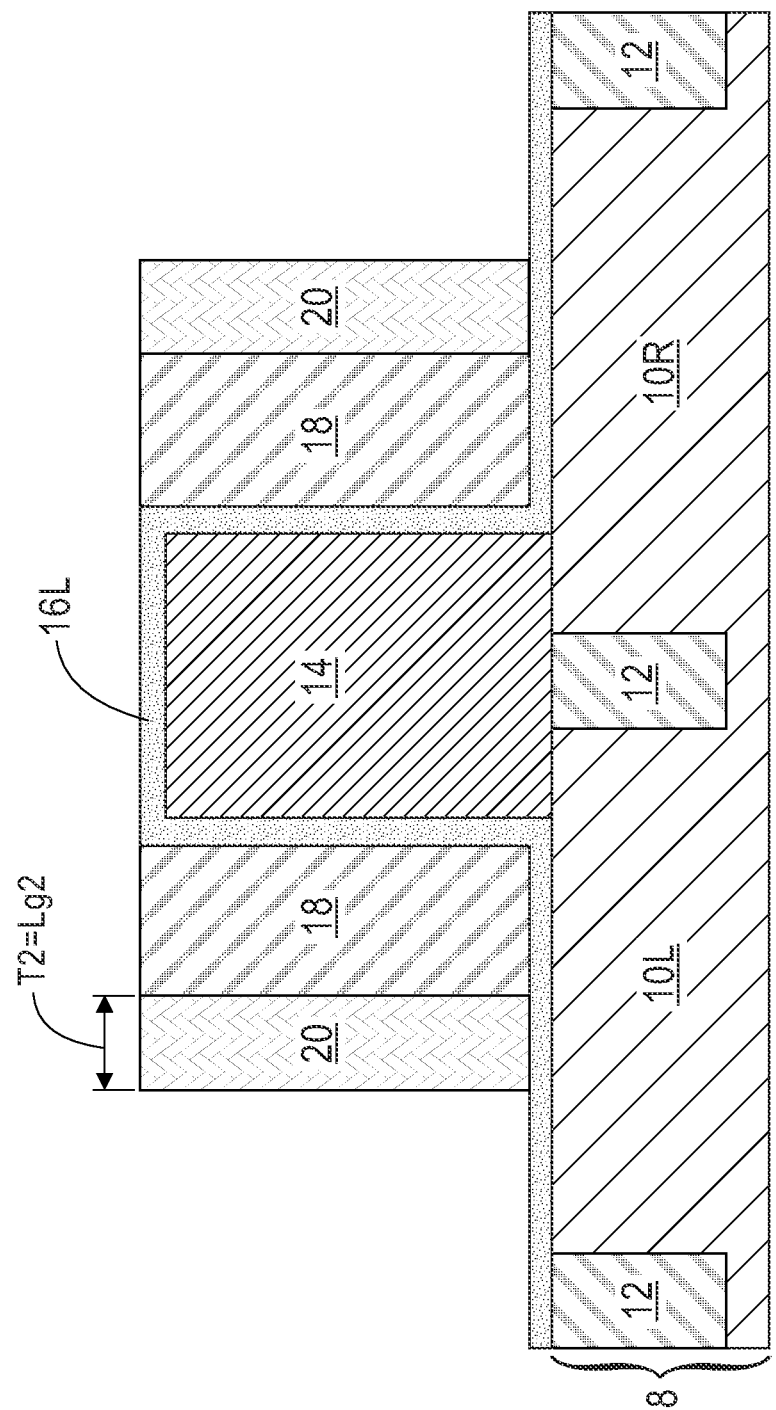
FIG. 4 is a cross sectional view of the exemplary semiconductor structure of FIG. 3 after forming a second sacrificial gate laterally adjacent to the first sacrificial gate.

Referring now to FIG. 4, there is illustrated the exemplary semiconductor structure of FIG. 3 after forming a second sacrificial gate 20 laterally adjacent to the first sacrificial gate 18. In some embodiments, the second sacrificial gate 20 can be composed of a second semiconductor material that is compositionally different from the first semiconductor material mentioned above for the first sacrificial gate 18. Illustrative examples of second semiconductor materials that can be used in providing the second sacrificial gate 20 include, but are not limited to, polysilicon, amorphous silicon, or amorphous silicon germanium. In other embodiments, the second sacrificial gate 18 can be composed of a second metal-containing material that is compositionally different from the first metal-containing mentioned above for the first sacrificial gate 18. Illustrative examples of second metal-containing materials include, but are not limited to, tungsten, titanium, tantalum, aluminum, nickel, ruthenium, palladium, platinum, or alloys thereof. The second semiconductor material and the second metal-containing material collectively can be referred to a "second sacrificial gate material". In accordance with the present application, the second sacrificial gate material is compositionally different from the first sacrificial gate 18 such that one of the sacrificial gate materials can be removed selectively to the other. In one example, the first sacrificial gate 18 is composed of amorphous silicon, while the second sacrificial gate 20 is composed of amorphous silicon germanium.

The second sacrificial gate 20 can be formed utilizing the technique mentioned above in forming the first sacrificial gate 18, i.e., the second sacrificial gate 20 can be formed by conformal deposition of the second sacrificial gate material, followed by a directional etch. The directional etch provides a second sacrificial gate 20 having a vertical pillar shape and a second lateral thickness T2 as measured from an innermost sidewall to an outermost sidewall of the vertical pillar. It is noted that the second lateral thickness T2 determines the second gate length Lg2 of the MGO-DWF FET of the present application. In some embodiments and as is illustrated in the drawings of the present application, T2 (and Lg2) is less than T1 (and Lg1). In other embodiments (not shown), T2 (and Lg2) is greater than T1 (and Lg1).

Figure 5:
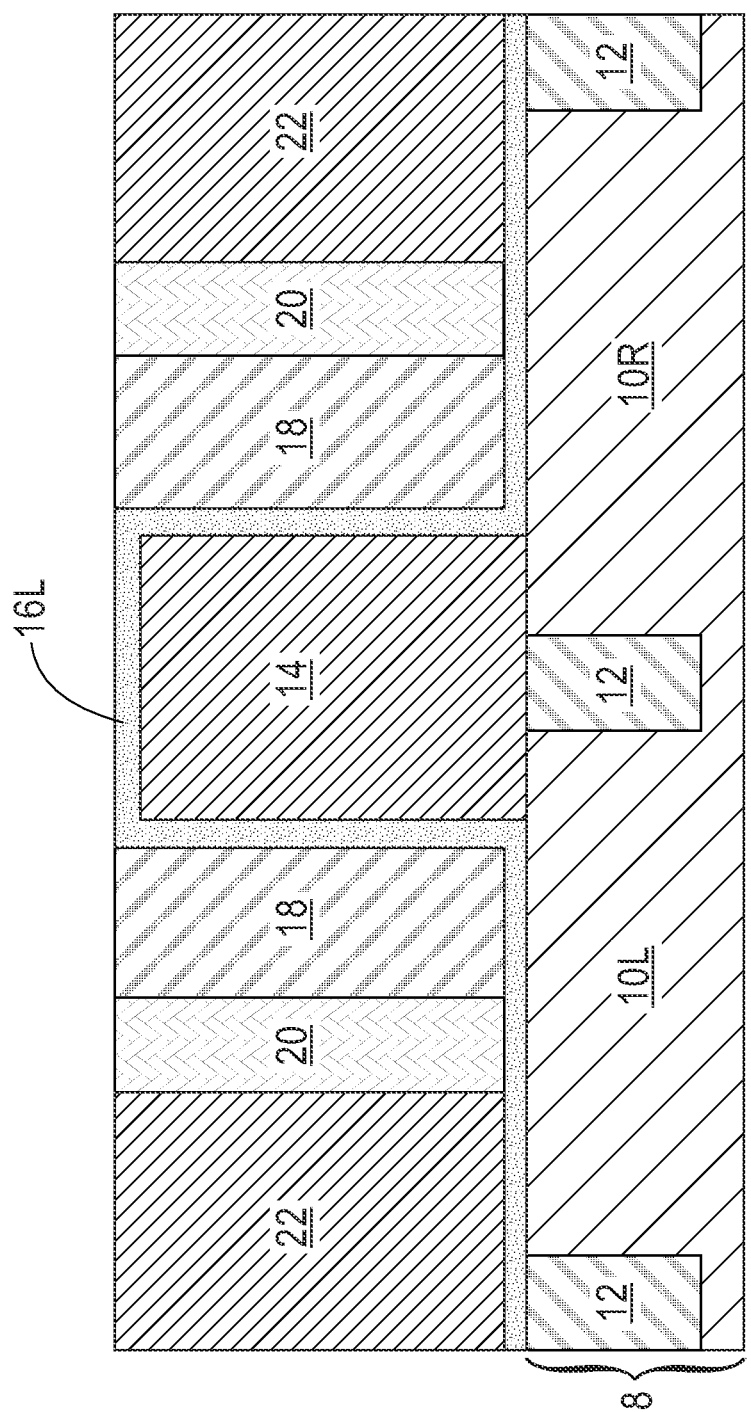
FIG. 5 is a cross sectional view of the exemplary semiconductor structure of FIG. 4 after forming a dielectric material fill laterally adjacent to the second sacrificial gate.

Referring now to FIG. 5, there is illustrated the exemplary semiconductor structure of FIG. 4 after forming a dielectric material fill 22 laterally adjacent to the second sacrificial gate 20. In some embodiments of the present application, this step of the present application can be omitted.

When present, the dielectric material fill 22 is composed of a dielectric fill material that is compositionally the same as the mandrel dielectric material that provides the mandrel structure 14. For example, the dielectric material fill 22 and the mandrel structure 14 both can be composed of silicon nitride. The dielectric material fill 22 can be formed by deposition (CVD, PECVD, or PVD) of a dielectric fill material, followed by planarization. When present, the dielectric fill 22 has a topmost surface that is coplanar with a topmost surface of each of the first and second sacrificial gates 18, 20 and a horizontal portion of the sacrificial gate dielectric material layer 16L that is located on the topmost surface of the mandrel structure 14.

Figure 6:
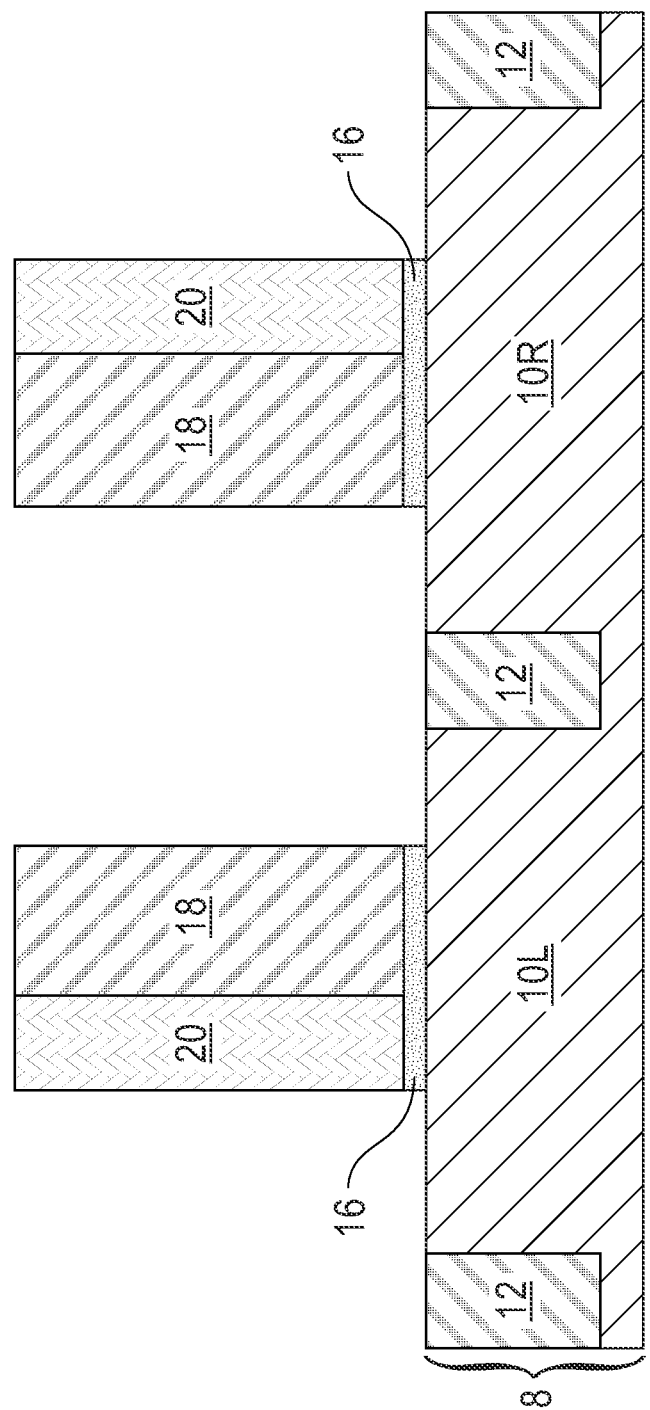
FIG. 6 is a cross sectional view of the exemplary semiconductor structure of FIG. 5 after removing the sacrificial gate dielectric material layer that is present on the topmost surface of the mandrel structure, removing the mandrel structure and the dielectric material fill, and removing physically exposed portions of the sacrificial gate dielectric material layer that are not protected by the first and second sacrificial gates.

Referring now to FIG. 6, there is illustrated the exemplary semiconductor structure of FIG. 5 after removing the sacrificial gate dielectric material layer 16L that is present on the topmost surface of the mandrel structure 14, removing the mandrel structure 14 and, if present, the dielectric material fill 22, and removing physically exposed portions of the sacrificial gate dielectric material layer 16L that are not protected by the first and second sacrificial gates 18, 20.

The removal of the sacrificial gate dielectric material layer 16L that is present on the topmost surface of the mandrel structure 14 can be performed utilizing a first etching process that is selective in removing the physically exposed portion of the sacrificial gate dielectric material layer 16L that is present on the topmost surface of the mandrel structure 14 so as to physically expose a topmost surface of the mandrel structure 14. A second etching process can be used to simultaneously remove both the mandrel structure 14 and the dielectric material fill 22. Exposed portions of the sacrificial gate dielectric material layer 16L that are not protected by the first and second sacrificial gates 18, 20 can then be removed utilizing a third etching process that is again selective in removing the physically exposed sacrificial gate dielectric material layer 16L that was previously located beneath the dielectric material fill 22.

When the dielectric material fill is not present, the first etching process mentioned above would remove the physically exposed portions of the sacrificial gate dielectric material layer 16L that are present on the topmost surface of both of the semiconductor substrate 8 and the mandrel structure 14. In this embodiment, the second etching process mentioned above removes only the mandrel structure 14.

At this point of the present application, and as is shown in FIG. 6, a first portion of the sacrificial gate dielectric material layer 16L remains beneath the first and second sacrificial gates 18, 20. This remaining first portion of the sacrificial gate dielectric material layer 16L can be referred to as a "first sacrificial gate dielectric material portion 16".

Figure 7:
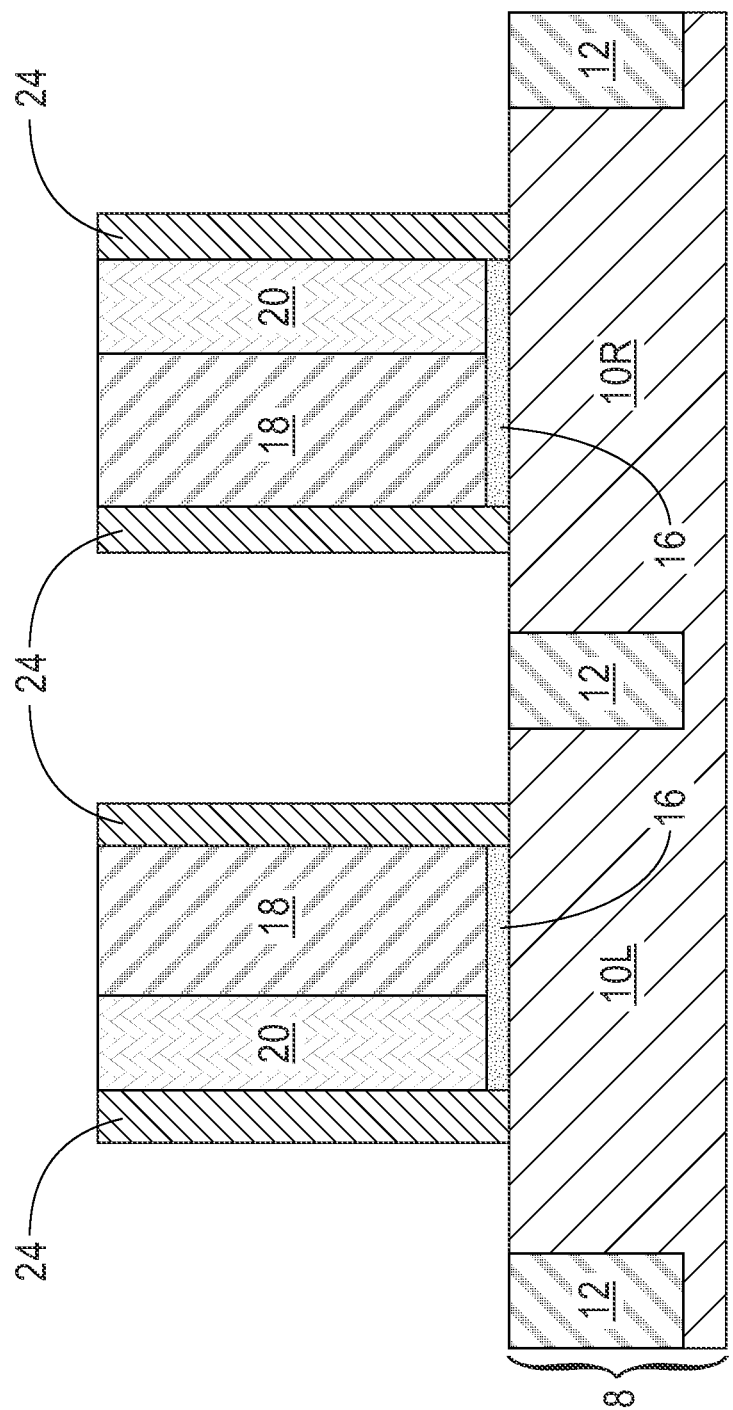
FIG. 7 is a cross sectional view of the exemplary semiconductor structure of FIG. 6 after forming a dielectric spacer laterally adjacent to a sidewall of both the first and second sacrificial gates and a first remaining portion of sacrificial gate dielectric material layer that is located beneath the first and second sacrificial gates.

Referring now to FIG. 7, there is illustrated the exemplary semiconductor structure of FIG. 6 after forming a dielectric spacer 24 laterally adjacent to a sidewall of both the first and second sacrificial gates 18, 20 and the first remaining portion of sacrificial gate dielectric material layer (i.e., first sacrificial gate dielectric material portion 16) that is located beneath the first and second sacrificial gates 18, 20.

The dielectric spacer 24 is composed of a spacer dielectric material such as, for example, silicon dioxide, silicon nitride, silicon oxynitride or SiOCN. The dielectric spacer 24 can be formed by first depositing the spacer dielectric material, and thereafter patterning the deposited spacer dielectric material. The depositing of the spacer dielectric material can include CVD, PECVC, PVD or ALD. The patterning of the deposited spacer dielectric material can be performed utilizing a spacer etching process such as, for example, reactive ion etching. The dielectric spacer 24 has a vertical pillar shape and the dielectric spacer 24 can have a lateral thickness, i.e., width, from 5 nm to 30 nm. At this point of the present application, the dielectric spacer 24 has a topmost surface that can be coplanar with a topmost surface of both the first and second sacrificial gates 18, 20, and a bottommost surface that contacts a topmost surface of one of the active regions 10L, 10R.

Figure 8:
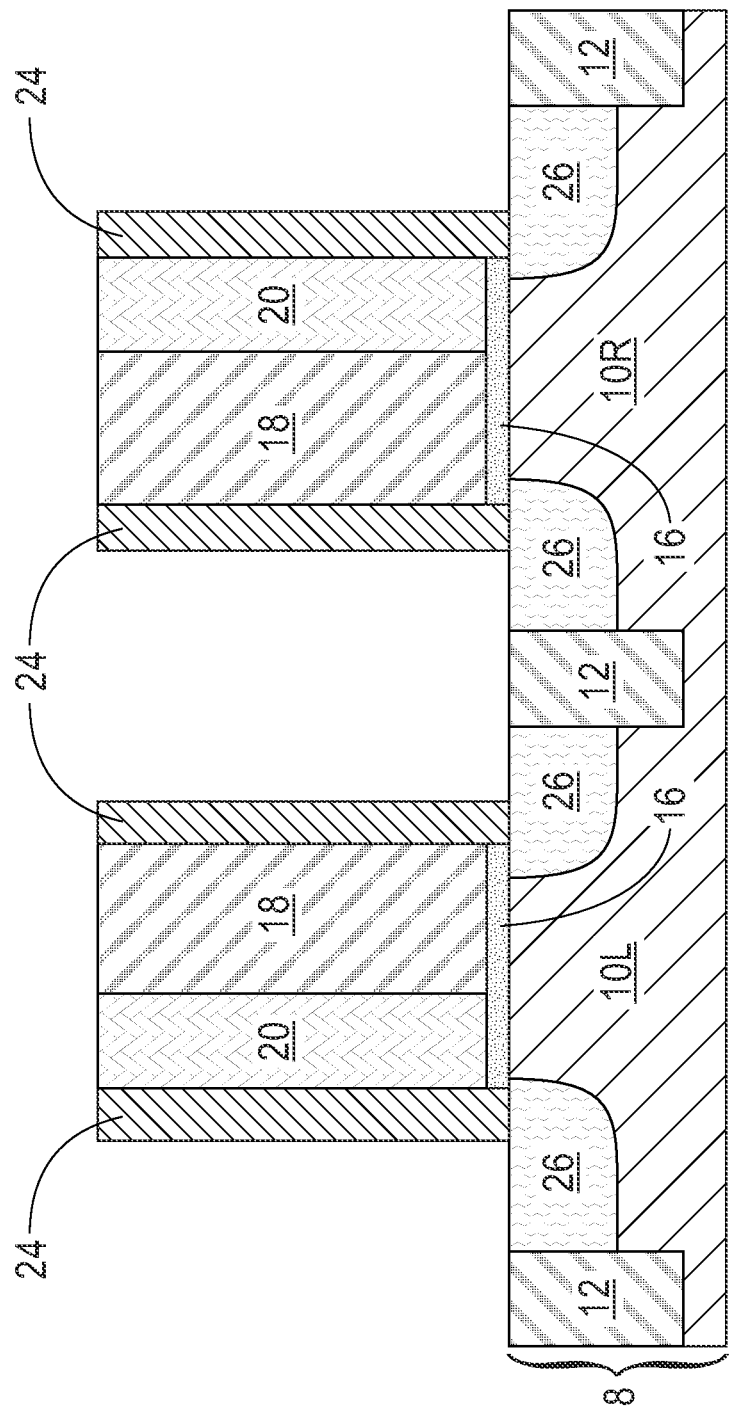
FIG. 8 is a cross sectional view of the exemplary semiconductor structure of FIG. 7 after forming source/drain regions in a portion of the at least one active region.

Referring now to FIG. 8, there is illustrated the exemplary semiconductor structure of FIG. 7 after forming source/drain regions 26 in a portion of the at least one active region 10L, 10R. In embodiments of the present application, and as is shown in FIG. 8, the source/drain regions 26 are located at a footprint of a structure including the dielectric spacer 24, the first and second sacrificial gates 18, 20 and the first sacrificial gate dielectric material portion 16.

As used herein, a "source/drain" region can be a source region or a drain region depending on subsequent wiring and application of voltages during operation of the MGO-DWF FET of the present application. In some embodiments, the source/drain regions 26 can be formed utilizing a doping technique, such as, for example, ion implantation. The doping technique includes introducing a dopant within the exposed semiconductor material portions of the at least one active regions 10L, 10R. The dopant that is used in forming the source/drain regions 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions 26 can have a dopant concentration of from $4\times10^{20}$ atoms/cm$^3$ to $3\times10^{21}$ atoms/cm$^3$.

In another embodiment, the source/drain regions 26 can be formed utilizing an epitaxy growth process. In some embodiments, and prior to performing the epitaxy growth process, a trench is formed in the semiconductor material portion of the at least one active region 10L, 10R and thereafter the epitaxy growth process is performed. In other embodiments, no trench is formed prior to performing the epitaxy growth process. In either embodiment, the epitaxy growth process includes forming at least a semiconductor material on a physically exposed semiconductor material portion of the at least one active region 10L, 10R. The semiconductor material that is used during the epitaxy growth process can be compositionally the same as, or compositionally different from, the semiconductor material that provides the at least one active region 10L, 10R. In some embodiments, the epitaxy growth process can be an in-situ epitaxial growth process in which one of the above mentioned dopants is present during the epitaxial growth of the semiconductor material. In other embodiments, one of the above mentioned dopants can be introduced into the epitaxial semiconductor material after the epitaxial growth process has been performed. In such a process, the dopant can be introduced via ion implantation or gas phase doping. It is noted that the epitaxial growth process provides an epitaxial semiconductor material that has a same crystal orientation as surface of the semiconductor material that it grown on.

Figure 9:
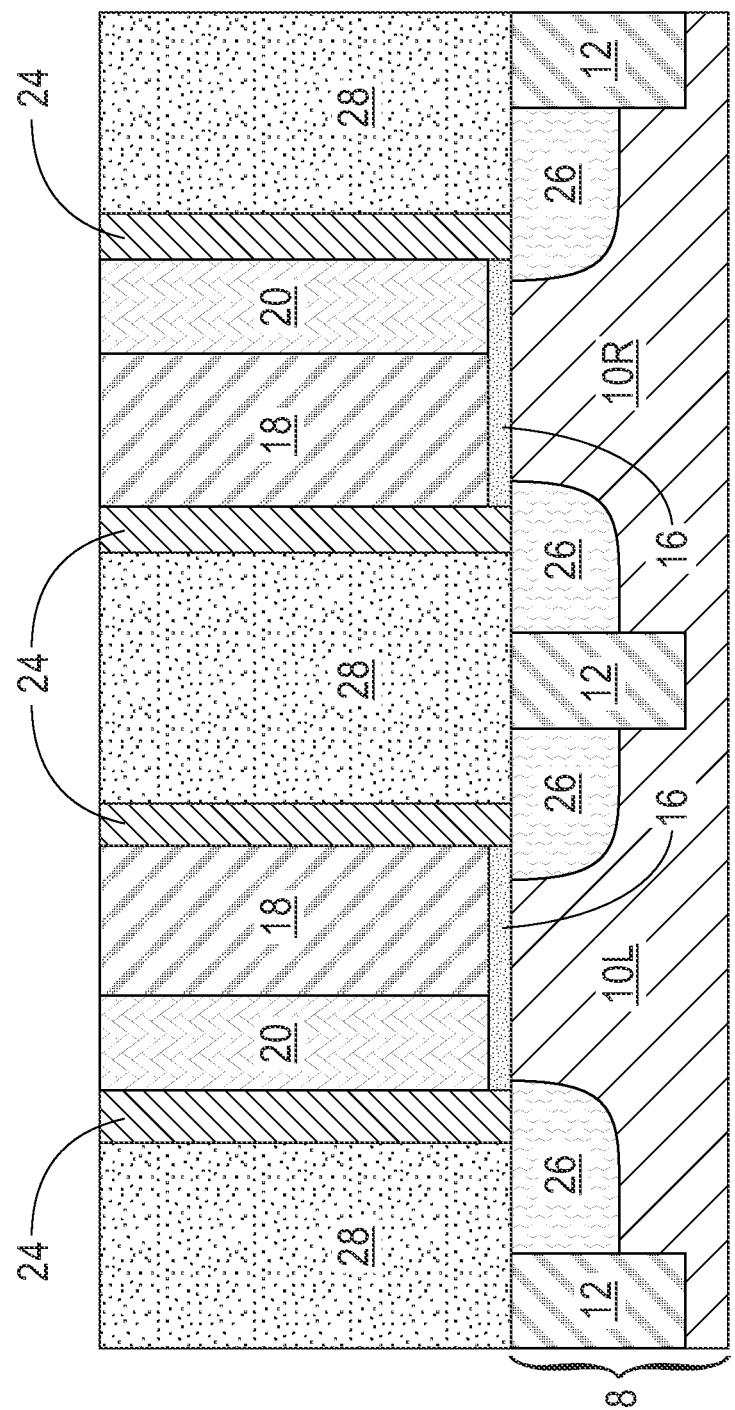
FIG. 9 is a cross sectional view of the exemplary semiconductor structure of FIG. 8 after forming an interlevel dielectric material layer laterally adjacent to the dielectric spacer.

Referring now to FIG. 9, there is illustrated the exemplary semiconductor structure of FIG. 8 after forming an interlevel dielectric (ILD) material layer 28 laterally adjacent to the dielectric spacer 24. At this point of the present application, the ILD material layer 28 has a topmost surface that is coplanar with a topmost surface of each of the dielectric spacer 24 and the first and second sacrificial gates 18, 20.

In one embodiment, the ILD material layer 28 can be composed silicon dioxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 28 can include a multi-layered structure that includes at least two different dielectric materials stacked one atop the other such as, for example, silicon nitride and silicon dioxide.

In one embodiment, the ILD material layer 28 can be formed utilizing a deposition process including, for example, CVD, PECVD, evaporation or spin-on coating. In some embodiments, a planarization process or an etch back process follows the deposition of the dielectric material that provides the ILD material layer 28.

Figure 10:
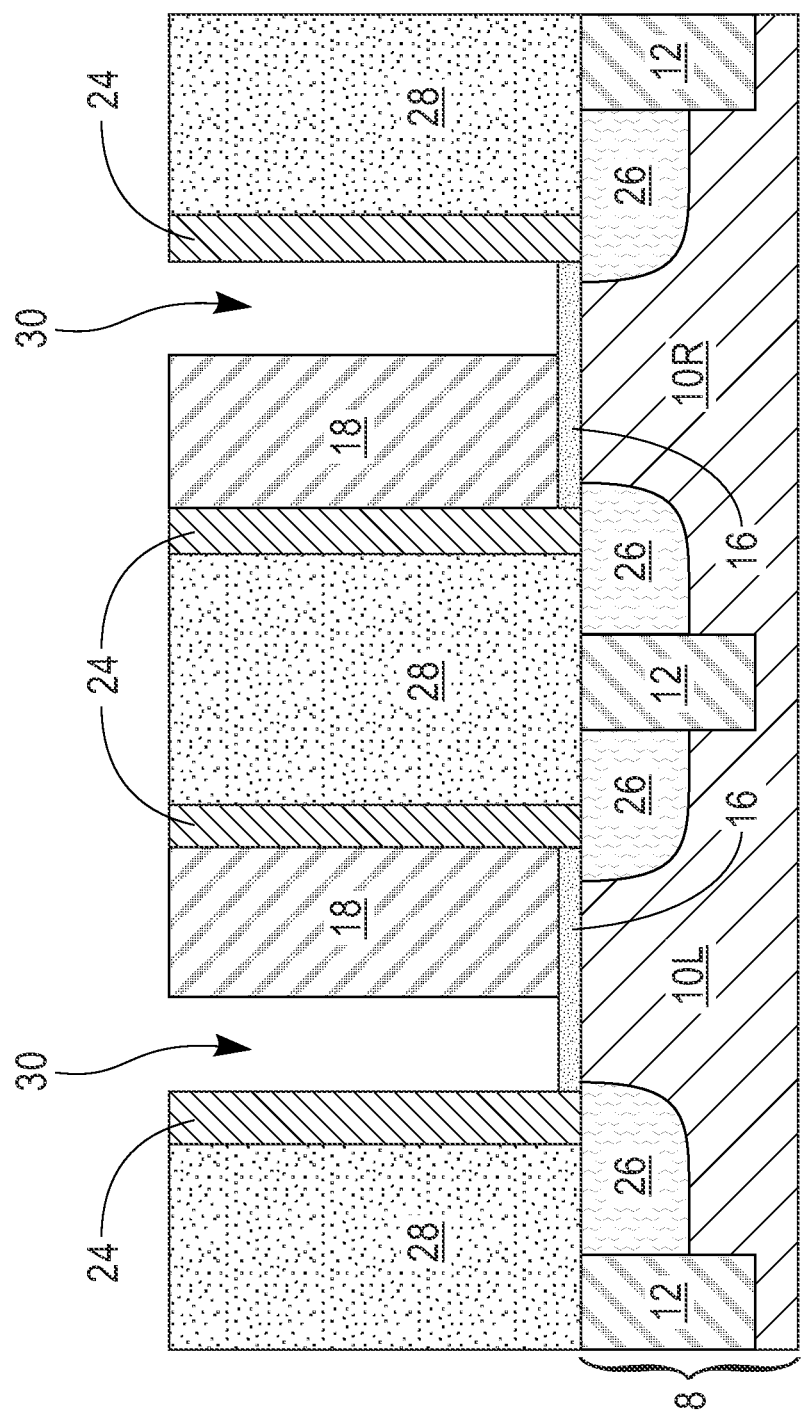
FIG. 10 is a cross sectional view of the exemplary semiconductor structure of FIG. 9 after removing the second sacrificial gate to provide a first cavity that physically exposes a portion of the first remaining portion of the sacrificial gate dielectric material layer.

Referring now to FIG. 10, there is illustrated the exemplary semiconductor structure of FIG. 9 after removing the second sacrificial gate 20 to provide a first cavity 30 that physically exposes the first remaining portion of the sacrificial gate dielectric material layer 16L (i.e., the first sacrificial gate dielectric material portion 16). The removal of the second sacrificial gate 20 can be performed utilizing a selective etching process that removes the second sacrificial material selectively as compared to the first sacrificial material that provides the first sacrificial gate 18. In one example, and when the second sacrificial gate 20 is composed of amorphous SiGe and the first sacrificial gate 18 is composed of amorphous Si, a liquid etchant including a mixture of ammonia and hydrogen peroxide can be used to remove the second sacrificial gate 20 selectively to the first sacrificial gate 18. In another example, and when the second sacrificial gate 20 is composed of amorphous SiGe and the first sacrificial gate 18 is composed of amorphous Si, a gas etchant including a hydrogen chloride (HCl) can be used to remove the second sacrificial gate 20 selectively to the first sacrificial gate 18.

Figure 11:
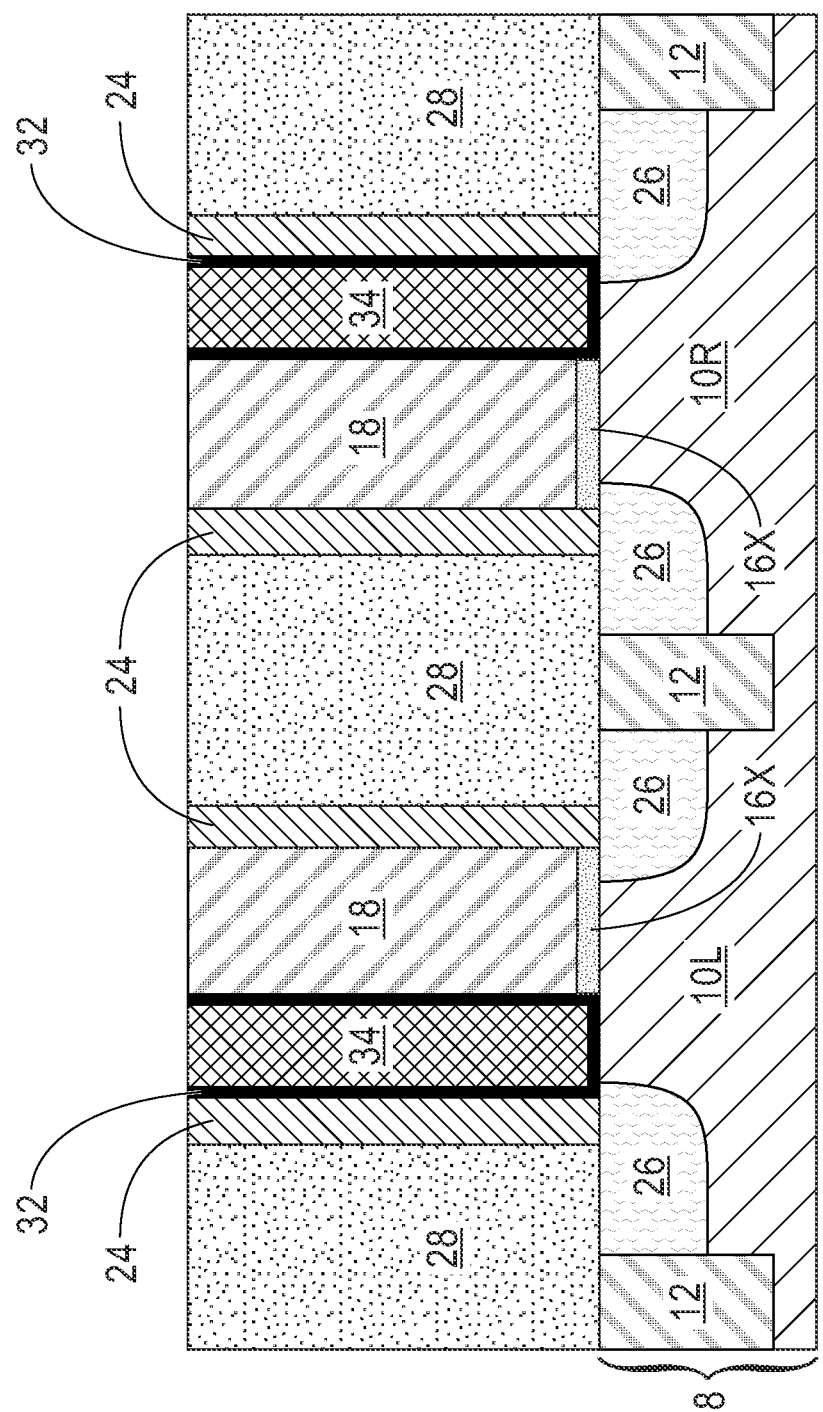
FIG. 11 is a cross sectional view of the exemplary semiconductor structure of FIG. 10 after removing the physically exposed portion of the first remaining portion of the sacrificial gate dielectric material layer, and forming a first high-k gate dielectric material layer and a first work-function metal-containing structure in the first cavity and on a physically exposed portion of the at least one active region of the semiconductor substrate.

Referring now to FIG. 11, there is illustrated the exemplary semiconductor structure of FIG. 10 after removing the physically exposed first remaining portion of the sacrificial gate dielectric material layer portion 16L (i.e., first sacrificial gate dielectric material portion 16), and forming a first high-k gate dielectric material layer 32 and a first work-function metal-containing structure 34 in the extended first cavity (not shown) and on a physically exposed portion of the at least one active region 10L, 10R of the semiconductor substrate 8.

The removing of the physically exposed first remaining portion of the sacrificial gate dielectric material layer portion 16L (i.e., first sacrificial gate dielectric material portion 16), which extends the first cavity 30 so as to physically expose a portion of the at least one active region 10L, 10R, includes an etching process that is selective in removing the dielectric material that was used in providing the sacrificial gate dielectric material layer 16L. A second portion of the remaining sacrificial gate dielectric material layer 16L remains beneath the first sacrificial gate 18. This second portion of the remaining sacrificial gate dielectric material layer 16L that remains beneath the first sacrificial gate 18 can be referred to herein a second sacrificial gate dielectric material portion 16X.

A continuous layer of a first high-k gate dielectric material, which provides the first high gate dielectric material layer 32, is then formed into the extended first cavity and atop the first sacrificial gate 18, the dielectric spacer 24 and the ILD material 28. The first high-k gate dielectric material has a dielectric constant, k. which is greater than the dielectric constant of silicon dioxide. Suitable first high-k gate dielectric materials include, but are not limited to, metal oxides such as hafnium oxide ($HfO_2$), hafnium silicon oxide (HfSiO), hafnium silicon oxynitride (HfSiON), lanthanum oxide ($La_2O_3$), hafnium aluminum oxide, hafnium tantalum oxide, lanthanum aluminum oxide ($LaAlO_3$), zirconium oxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The first high-k gate dielectric material can further include dopants such as lanthanum (La), aluminum (Al) and/or magnesium (Mg).

The continuous layer of the first high-k gate dielectric material can be formed utilizing a deposition process such as, for example, CVD, PECVD, or PVD. The continuous layer of the first high-k gate dielectric material is a conformal layer having a first thickness. In one embodiment, the first thickness of the continuous layer of the first high-k gate dielectric material is from 1 nm to 10 nm. It is noted that the first thickness of the first high-k gate dielectric material does not fill in the entirety of the extended first cavity.

After forming the continuous layer of the first high-k gate dielectric material, a first work-function metal-containing material is formed on the continuous layer of the first high-k gate dielectric material that is present inside and outside of the extended first cavity.

In some embodiments, the first work-function metal-containing material can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, tantalum carbide, hafnium carbide, or combinations thereof.

In other embodiments, the first work-function metal-containing material can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

The first work-function metal-containing material can be formed by a deposition process including but not limited to, CVD, PECVD, PVD, ALD, sputtering, or plating. The first work-function metal-containing material fills in a remaining volume of the extended first cavity.

After forming the first work-function metal-containing material on the continuous layer of the first high-k gate dielectric material, a material removal process such as, for example, planarization, can be performed to remove the first work-function metal-containing material and the continuous layer of the first high-k gate dielectric material that is present outside the first extended cavity and atop the dielectric spacer 24, the ILD material layer 28 and the first sacrificial gate 18. A portion of each of the first work-function metal-containing material and the continuous layer of the first high-k gate dielectric material remains in the extended first cavity. The portion of the continuous layer of continuous layer of the first high-k gate dielectric material that remains in the extended first cavity can be referred to herein as a first high-k gate dielectric material layer 32, and the portion of the first work-function metal-containing material that remains in the extended first cavity can be referred to herein as a first work-function metal-containing structure 34. The first high-k gate dielectric material layer 32 is U-shaped, and is present along a sidewall and a bottom wall of the first work-function metal-containing structure 34. The first high-k gate dielectric material layer 32 has a topmost surface that is coplanar with a topmost surface of the first work-function metal-containing structure 34, as well as with a topmost surface of the ILD material layer 28.

Collectively, the first high-k gate dielectric material layer 32 and the first work-function metal-containing structure 34 provide a first functional gate structure of the MGO-DWF FET. The first functional gate structure 32/34 of the MGO-DWF FET has a topmost surface that is coplanar with the ILD material layer 28. The first functional gate structure 32/34 of the MGO-DWF FET has the second gate length, Lg2.

Figure 12:
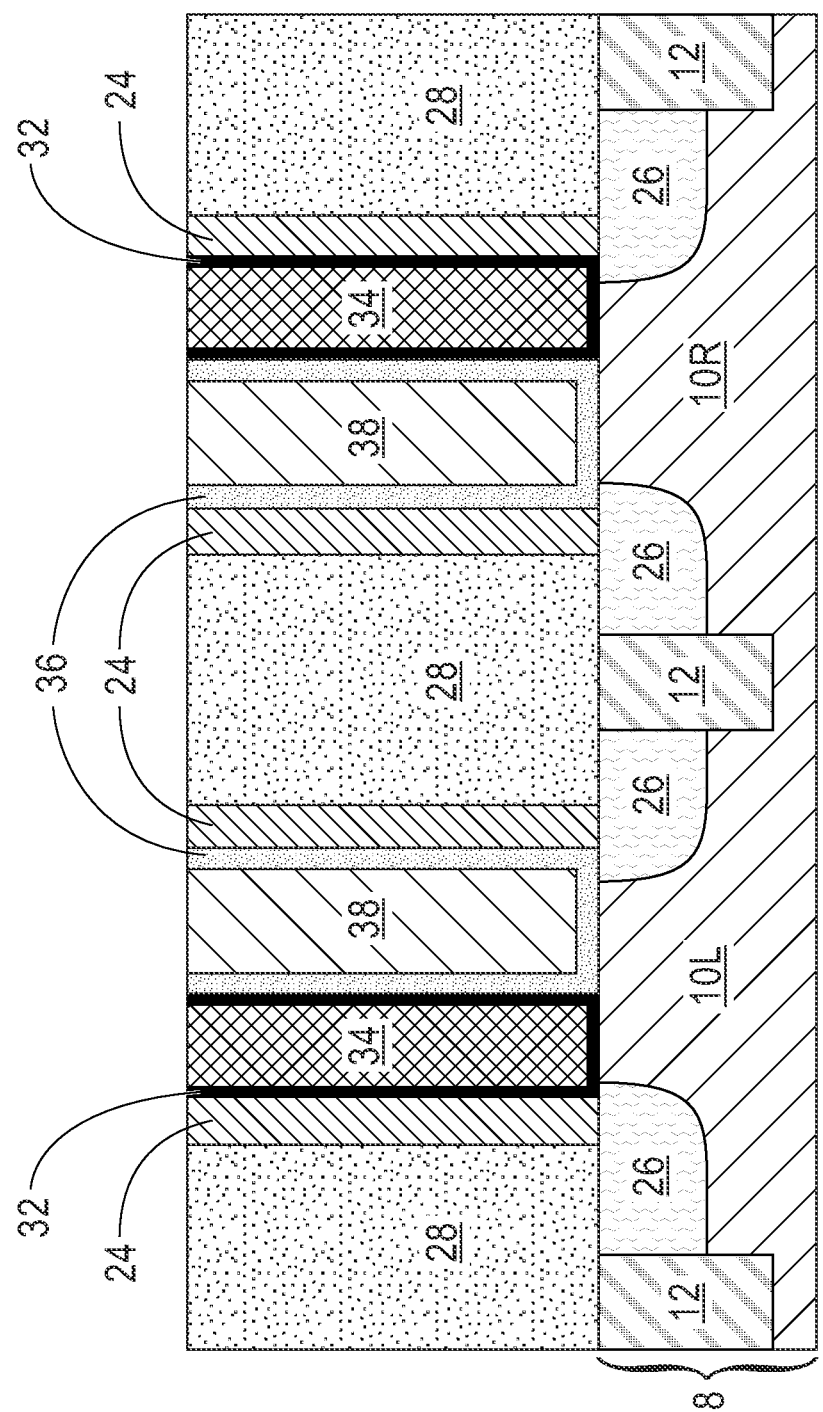
FIG. 12 is a cross sectional view of the exemplary semiconductor structure of FIG. 11 after removing the first sacrificial gate and a second remaining portion of the remaining sacrificial gate dielectric material layer that is located beneath the first sacrificial gate to provide a second cavity, and forming a second high-k gate dielectric material layer and a second work-function metal-containing structure in the second cavity and on another physically exposed portion of the at least one active region of the semiconductor substrate.

Referring now to FIG. 12, there is illustrated the exemplary semiconductor structure of FIG. 11 after removing the first sacrificial gate 18 and a second remaining portion of the sacrificial gate dielectric material layer 16L (i.e., the second sacrificial gate dielectric material portion 16X) to provide a second cavity (not shown), and forming a second high-k gate dielectric material layer 36 and a second work-function metal 38 in the second cavity and on another physically exposed portion of the at least one active region 10L, 10R of the semiconductor substrate 8.

The removal of the first sacrificial gate 18 can be performed utilizing a selective etching process that removes the first sacrificial material. In one example, an aqueous solution containing ammonia can be used to remove the first sacrificial gate 18 when it comprises amorphous silicon. The removing of the second remaining portion of the sacrificial gate dielectric material layer portion 16L (i.e., second sacrificial gate dielectric material portion 16X), includes an etching process that is selective in removing the dielectric material that was used in providing the sacrificial gate dielectric material layer 16L.

A continuous layer of a second high-k gate dielectric material, which provides the second high gate dielectric material layer 36 is then formed into the second cavity and atop the first functional gate structure 32/24, the dielectric spacer 24 and the ILD material 28. The second high-k gate dielectric material is composed of one of dielectric materials mentioned above for the continuous layer of the first high-k gate dielectric material provided that the second high-k gate dielectric material is compositionally different from the first high-k gate dielectric material. In one example, the first high high-k gate dielectric material is composed of hafnium oxide, and the second high-k gate dielectric material is composed of hafnium aluminum oxide, or hafnium tantalum oxide The continuous layer of the second high-k gate dielectric material can be formed utilizing a deposition process such as, for example, CVD, PECVD, or PVD. The continuous layer of the second high-k gate dielectric material is a conformal layer having a second thickness. In one embodiment, and as is illustrated in FIG. 12, the second thickness of the continuous layer of the second high-k gate dielectric material is greater than the first thickness of the continuous layer of the first high-k gate dielectric material. In another embodiment (not illustrated), the second thickness of the continuous layer of the second high-k gate dielectric material is less than the first thickness of the continuous layer of the first high-k gate dielectric material. It is noted that the thickness of the continuous layer of the first and second high-k gate dielectric materials is dependent on T1 (and Lg1) and T2 (and Lg2). For example, when T1 (and Lg1) is greater than T2 (and Lg2), then the second thickness of the continuous layer of the second high-k gate dielectric material is greater than the first thickness of the continuous layer of the first high-k gate dielectric material. When T1 (and Lg1) is less than T2 (and Lg2), then the second thickness of the continuous layer of the second high-k gate dielectric material is less than the first thickness of the continuous layer of the first high-k gate dielectric material.

In one example, and when the second thickness is greater than the first thickness, than the second thickness of the continuous layer of the second high-k gate dielectric material can be from 2 nm to 15 nm. It is noted that the second thickness of the second high-k gate dielectric material does not fill in the entirety of the second cavity.

After forming the continuous layer of the second high-k gate dielectric material, a second work-function metal-containing material is formed on the continuous layer of the second high-k gate dielectric material that is present inside and outside of the second cavity. Second work-function metal-containing material selected to provide a different work-function setting function that the first work-function metal-containing material. Thus, and in one embodiment, when the first work-function metal-containing material effectuates a p-type threshold voltage shift, then the second work-function metal-containing material effectuates an n-type threshold voltage shift. In another embodiment, when the first work-function metal-containing material effectuates an n-type threshold voltage shift, then the second work-function metal-containing material effectuates an p-type threshold voltage shift.

The second work-function metal-containing material can be formed by a deposition process including but not limited to, CVD, PECVD, PVD, ALD, sputtering, or plating. The second work-function metal-containing material fills in a remaining volume of the second cavity.

After forming the second work-function metal-containing material on the continuous layer of the second high-k gate dielectric material, a material removal process such as, for example, planarization, can be performed to remove the second work-function metal-containing material and the continuous layer of the second high-k gate dielectric material that is present outside the second cavity and atop the first functional gate structure 32/34, the dielectric spacer 24 and the ILD material layer 28. A portion of each of the second work-function metal-containing material and the continuous layer of the second high-k gate dielectric material remains in the second cavity. The portion of the continuous layer of the second high-k gate dielectric material that remains in the second cavity can be referred to herein as a second high-k gate dielectric material layer 36, and the portion of the second work-function metal-containing material that remains in the second cavity can be referred to herein as a second work-function metal-containing structure 38. The second high-k gate dielectric material layer 36 is U-shaped, is present along a sidewall and bottom wall of the second work-function metal-containing structure 38, and has a vertical extending portion that is in direct physical contact with a vertical extending portion of the U-shaped first high-k gate dielectric material layer 32. The second high-k gate dielectric material layer 36 has a topmost surface that is coplanar with a topmost surface of the second work-function metal-containing structure 38, as well as with a topmost surface of each of the ILD material layer 28, the dielectric spacer 24 and the first functional gate structure 32/34 of the MGO-DWF FET.

Collectively, the second high-k gate dielectric material layer 36 and the second work-function metal-containing structure 36 provide a second functional gate structure of the MGO-DWF FET. The second functional gate structure 36/38 of the MGO-DWF FET has the first gate length, Lg1. As is shown, the second functional gate structure 36/28 is located laterally adjacent, and in direct physical contact with, the first functional gate structure 32/34. As is shown, dielectric spacer 24 is located on each side of the MGO-DWF FET. As is noted herein, the gate lengths of the two asymmetrical functional gate structures that provide the MGO-DWF FET of the present application are different.

In way of one example, and is illustrated in FIG. 12 of the present application, the first functional gate structure 32/34 of the MGO-DWF FET has Lg2, and the second functional gate structure 36/38 of the MGO-DWF FET has Lg1 which is greater than Lg2. In such an embodiment, the first high-k gate dielectric material layer 32 has a first thickness and the second high-k gate dielectric material layer 36 has a second thickness that is greater than the first thickness. Also, and in such an embodiment, the first work-function metal-containing structure 34 is composed of a work-function setting material that effectuates a p-type threshold voltage shift, and the second work-function metal-containing structure 38 composed of a work-function setting material that effectuates an n-type threshold voltage shift. In such an embodiment, the source/drain region 26 that is closest to the first functional gate structure 32/34 represents a source region of the MGO-DWF FET, while the source/drain region 26 closest to the second functional gate structure 36/38 represents a drain region of the MGO-DWF FET. Thus, and in this embodiment, the first functional gate structure 32/34 is located on a source side of the MGO-DWF FET, while the second functional gate structure 36/38 is located on a drain side of the MGO-DWF FET.

In way of another example (not illustrated), the first functional gate structure 32/34 of the MGO-DWF FET has Lg2, and the second functional gate structure 36/38 of the MGO-DWF FET has Lg1 which is less than Lg2. In such an embodiment, the first high-k gate dielectric material layer 32 has a first thickness and the second high-k gate dielectric material layer 36 has a second thickness that is less than the first thickness. Also, and in such an embodiment, the first work-function metal-containing structure 34 is composed of a work-function setting material that effectuates an n-type threshold voltage shift, and the second work-function metal-containing structure 38 composed of a work-function setting material that effectuates a p-type threshold voltage shift. In such an embodiment, the source/drain region 26 that is closest to the first functional gate structure 32/34 represents a drain region of the MGO-DWF FET, while the source/drain region 26 closest to the second functional gate structure 36/38 represents a source region of the MGO-DWF FET. Thus, and in this embodiment, the first functional gate structure 32/34 is located on a drain side of the MGO-DWF FET, while the second functional gate structure 36/38 is located on a source side of the MGO-DWF FET.

Figure 13:
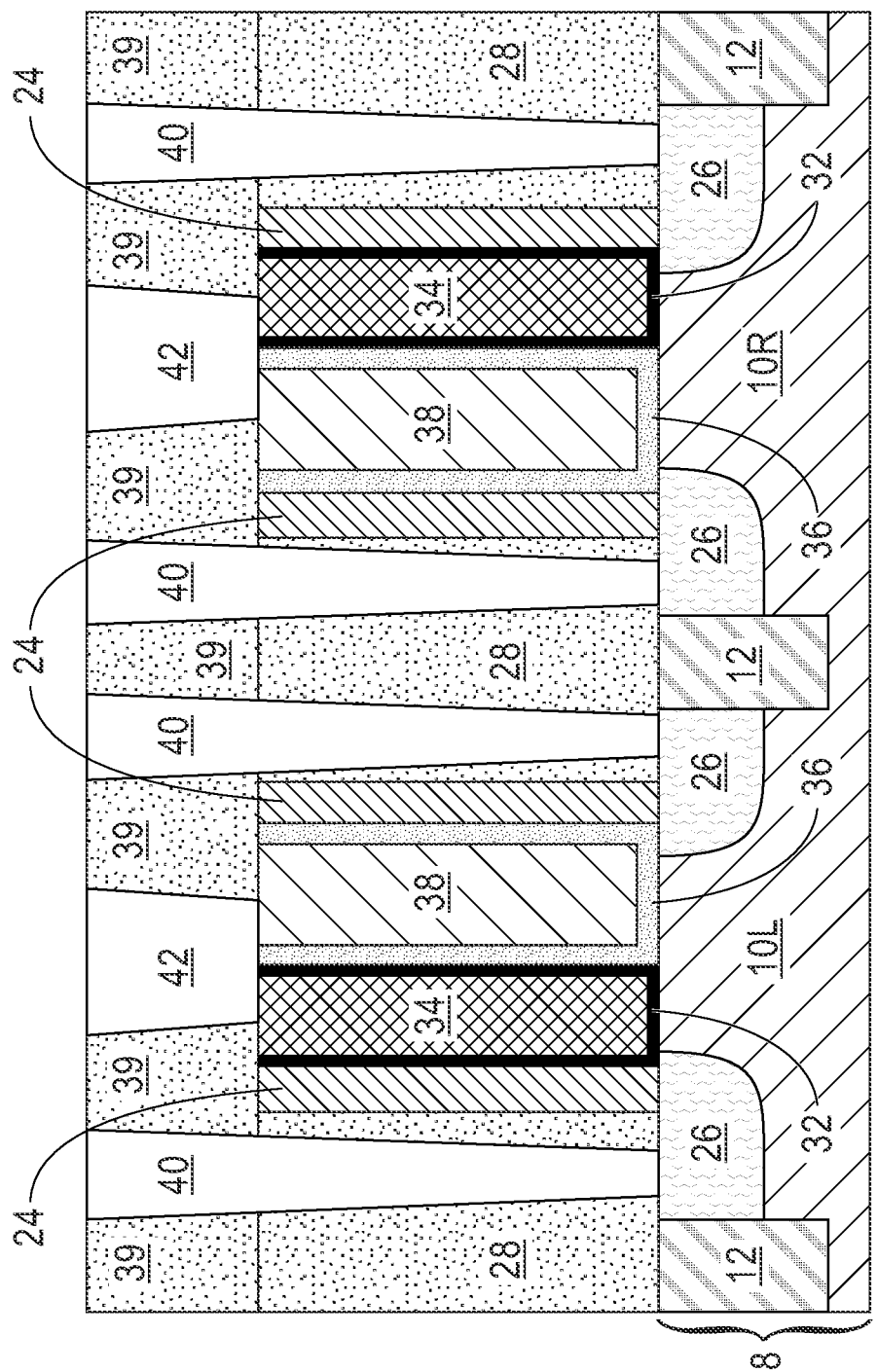
FIG. 13 is a cross sectional view of the exemplary semiconductor structure of FIG. 12 after forming another interlevel dielectric material layer and forming source/drain contact structures and a gate contact structure.

Referring now to FIG. 13, there is illustrated the exemplary semiconductor structure of FIG. 12 after forming another interlevel dielectric material layer 39 and forming source/drain contact structures 40 and a gate contact structure 42. In the present application, the gate contact structure 42 directly contacts both the first functional gate structure 33/34 and the second functional gate structure 36/38.

The another ILD material layer 39 can include one of the dielectric materials mentioned above for the ILD material layer 28. The another ILD material layer 39 can be formed utilizing one of the deposition processes mentioned above for forming the dielectric material layer 28.

After forming the another ILD material layer 39, source/drain contact openings and a gate contact opening are formed into the another ILD material layer 39 by lithography and etching. The source/drain contact openings and a gate contact opening can be formed simultaneously or one of the contact openings (i.e., source/drain contact openings or gate contact opening) is formed prior to the other.

In some embodiments (not shown), a metal semiconductor alloy region can be formed in each of the source/drain contact openings and on an upper surface of the source/drain region 26. The metal semiconductor alloy region can be composed of a silicide or germicide. In one or more embodiments of the present application, the metal semiconductor alloy region can be formed by first depositing a metal layer (not shown) in each of the source/drain contact openings and on an upper surface of the source/drain region 26. The metal layer can include a metal such as Ni, Co, Pt, W, Ti, Ta, a rare earth metal (e.g., Er, Yt, La), an alloy thereof, or any combination thereof. The metal layer can be deposited by CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions 26 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. A source/drain contact material is then deposited in the source/drain contact openings (not shown) to form the source/drain contacts 40.

The source/drain contacts 40 can include one or more source/drain contact liners (not shown) formed along sidewalls of the ILD material layers 28 and 39 and above an upper surface of the source/drain regions 26. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

A contact conductor material is subsequently deposited into each of the contact openings to completely fill a remaining volume of the source/drain contact openings. The contact conductor material can include a metal such as, for example, W, Cu, Al, Co, Ru, Mo, Os, Ir, Rh or an alloy thereof. The contact conductor layer can be formed by any suitable deposition method such as, for example, CVD, PVD or plating. A planarization process can be used to remove the contact conductor material and the contact liner (when provided) that are located above the top surface of the another ILD material layer 39. The remaining contact conductor material and if present, the contact liner and the metal semiconductor alloy region provide source/drain contact structure 40.

Gate contact opening can be processed in a manner similar to that used in forming the source/drain contact structures 40 with the exception that no metal semiconductor alloy region is typically formed on the first functional gate structure 33/34 and the second functional gate structure 36/38. As a result of such processing, a gate contact structure 42 is formed in the gate contact opening. Gate contact structure 42 includes a remaining portion of a contact conductor material and if present, a remaining portion of the contact liner. The gate contact structure 42 can include a contact conductor material that is compositionally the same as, or compositionally different from, the contact conductor material that provides the source/drain contact structures 40. Also, the gate contact structure 42 can include a contact liner that is compositionally the same as, or compositionally different from, the contact liner that provides the source/drain contact structures 40. As is shown, the gate contact structure 42 has a topmost surface that is coplanar with a topmost surface of each of the source/drain contact structures 40 and the another dielectric material layer 39.

The terminology used herein is for the purpose of describing particular embodiments only and is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a multiple gate dielectrics and dual work-functions field effect transistor (MGO-DWF-FET) located on an active region of a semiconductor substrate, wherein the MGO-DWF-FET comprises a first functional gate structure comprising a U-shaped first high-k gate dielectric material layer and a first work-function metal-containing structure, and a laterally adjacent, and contacting, second functional gate structure comprising a U-shaped second high-k gate dielectric material layer and a second work-function metal-containing structure;
a dielectric spacer located on an outermost sidewall of each of the first and second functional gate structures;
an interlevel dielectric material layer laterally adjacent to the dielectric spacer;
another interlevel dielectric material layer laterally above each of the interlevel dielectric material layer, the dielectric spacer, and the MGO-DWF-FET; and
a gate contact structure located in the another interlevel dielectric material layer, wherein the gate contact structure contacts both the first and second functional gate structures.

2. The semiconductor structure of claim 1, further comprising source/drain contact structures located in the another interlevel dielectric material layer and the interlevel dielectric material, wherein each of the source/drain contact structures contacts a source/drain region that is located adjacent to the MGO-DWF-FET.

3. The semiconductor structure claim 1, wherein the U-shaped first high-k gate dielectric material layer is composed of a high-k gate dielectric material that differs from a high-k gate dielectric material that provides the U-shaped second high-k gate dielectric material layer.

4. The semiconductor structure of claim 3, wherein the first work-function metal-containing structure is composed of a work-function metal-containing material that has a different work-function than a work-function metal-containing material that provides the second work-function metal-containing structure.

5. The semiconductor structure of claim 1, wherein the gate length of the first functional gate structure is less than the gate length of the second functional gate structure.

6. The semiconductor structure of claim 5, wherein the U-shaped first high-k gate dielectric material layer has a thickness that is less than a thickness of the U-shaped second high-k gate dielectric material layer, the first work-function metal-containing structure is composed of a first work-function metal-containing material that effectuates a p-type threshold voltage shift, and the second work-function metal-containing structure is composed of a second work-function metal-containing material that effectuates an n-type threshold voltage shift.

7. The semiconductor structure of claim 5, wherein the first functional gate structure is located on a source side of the MGO-DWF-FET, and the second functional gate structure is located on a drain side of the MGO-DWF-FET.

8. The semiconductor structure of claim 1, wherein the gate length of the first functional gate structure is greater than the gate length of the second functional gate structure.

9. The semiconductor structure of claim 8, wherein the U-shaped first high-k gate dielectric material layer has a thickness that is greater than a thickness of the U-shaped second high-k gate dielectric material layer, the first work-function metal-containing structure is composed of a first work-function metal-containing material that effectuates an n-type threshold voltage shift, and the second work-function metal-containing structure is composed of a second work-function metal-containing material that effectuates a p-type threshold voltage shift.

10. The semiconductor structure of claim 8, wherein the first functional gate structure is located on a drain side of the MGO-DWF-FET, and the second functional gate structure is located on a source side of the MGO-DWF-FET.

11. The semiconductor structure of claim 1, wherein a vertical extending portion of the U-shaped first high-k gate dielectric material layer directly contact a vertical extending portion of the U-shaped second high-k gate dielectric material layer.

12. The semiconductor structure of claim 1 wherein the first functional gate structure has a topmost surface that is coplanar with a topmost surface of the second functional gate structure.

13. A method of forming a semiconductor structure, the method comprising:
forming a sacrificial gate dielectric material layer on an active region and exposed sidewalls and a topmost surface of a mandrel structure that is located on an active region of a semiconductor substrate;
forming a first sacrificial gate laterally adjacent to a vertical portion of the sacrificial gate dielectric material layer that is present along sidewalls of the mandrel structure;
forming a second sacrificial gate laterally adjacent to the first sacrificial gate, wherein the first sacrificial gate has a lateral thickness that differs from a lateral thickness of the second sacrificial gate;
removing the sacrificial gate dielectric material layer that is present on the topmost surface of the mandrel structure;
removing the mandrel structure and the sacrificial gate dielectric material layer that is not protected by the first and second sacrificial gates;
replacing the second sacrificial gate and the sacrificial gate dielectric material layer that is located beneath the second sacrificial gate with a first functional gate structure comprising a U-shaped first high-k gate dielectric material layer and a first work-function metal-containing structure; and
replacing the first sacrificial gate and the sacrificial gate dielectric material layer that is located beneath the first sacrificial gate with a second functional gate structure comprising a U-shaped second high-k gate dielectric material layer and a second work-function metal-containing structure.

14. The method of claim 13, further comprising:
forming a dielectric spacer laterally adjacent to a sidewall of the second sacrificial gate;
forming source/drain regions in a portion of the active region; and
forming an interlevel dielectric material layer laterally adjacent to the dielectric spacer.

15. The method of claim 14, further comprising forming, after replacing the first sacrificial gate and the sacrificial gate dielectric material layer that is located beneath the first sacrificial gate, another interlevel dielectric material layer atop the interlevel dielectric material layer and both the first and second functional gate structures, wherein the another interlevel dielectric material layer includes source/drain contact structures contacting the source/drain regions and a gate contact structure contacting both the first and second functional gate structures.

16. The method of claim 13, wherein the first functional gate structure has a gate length that differs from a gate length of the second functional gate structure.

17. A semiconductor structure comprising:
a multiple gate dielectrics and dual work-functions field effect transistor (MGO-DWF-FET) located on an active region of a semiconductor substrate, wherein the MGO-DWF-FET comprises a first functional gate structure comprising a U-shaped first high-k gate dielectric material layer and a first work-function metal-containing structure, and a laterally adjacent, and contacting, second functional gate structure comprising a U-shaped second high-k gate dielectric material layer and a second work-function metal-containing structure, wherein the gate length of the first functional gate structure is less than the gate length of the second functional gate structure, and wherein the U-shaped first high-k gate dielectric material layer has a thickness that is less than a thickness of the U-shaped second high-k gate dielectric material layer, the first work-function metal-containing structure is composed of a first work-function metal-containing material that effectuates a p-type threshold voltage shift, and the second work-function metal-containing structure is composed of a second work-function metal-containing material that effectuates an n-type threshold voltage shift.

* * * * *